United States Patent
Kim et al.

(10) Patent No.: US 7,612,621 B2
(45) Date of Patent: Nov. 3, 2009

(54) SYSTEM FOR PROVIDING OPEN-LOOP QUADRATURE CLOCK GENERATION

(75) Inventors: Kyu-hyoun Kim, Mount Kisco, NY (US); Paul W. Coteus, Yorktown Heights, NY (US); Daniel M. Dreps, Georgetown, TX (US)

(73) Assignee: International Business Machines Corporation, Armonk, NY (US)

( * ) Notice: Subject to any disclaimer, the term of this patent is extended or adjusted under 35 U.S.C. 154(b) by 153 days.

(21) Appl. No.: 11/749,409

(22) Filed: May 16, 2007

(65) Prior Publication Data

US 2008/0285697 A1     Nov. 20, 2008

(51) Int. Cl.
    *H03B 27/00*     (2006.01)

(52) U.S. Cl. .............. 331/57; 331/45; 331/74; 327/156

(58) Field of Classification Search .......... 331/57, 331/45, 74; 327/156
See application file for complete search history.

(56) References Cited

U.S. PATENT DOCUMENTS

| | | | |
|---|---|---|---|
| 5,565,817 A | * | 10/1996 | Lakshmikumar .......... 331/57 |
| 7,057,433 B2 | | 6/2006 | Cho |
| 7,135,935 B2 | | 11/2006 | Kim |
| 7,199,630 B2 | | 4/2007 | Kim |
| 7,362,187 B1 | * | 4/2008 | Lai et al. .......... 331/45 |
| 2004/0222829 A1 | | 11/2004 | Cho |
| 2007/0090866 A1 | | 4/2007 | Park |
| 2007/0090867 A1 | | 4/2007 | Kim |
| 2007/0109032 A1 | | 5/2007 | Park |
| 2007/0109058 A1 | | 5/2007 | Kim |

FOREIGN PATENT DOCUMENTS

| | | |
|---|---|---|
| DE | 102004042900 | 4/2005 |
| JP | 2005094754 | 4/2004 |
| JP | 2007006492 | 1/2007 |

* cited by examiner

*Primary Examiner*—Arnold Kinkead
(74) *Attorney, Agent, or Firm*—Cantor Colburn LLP

(57) ABSTRACT

A system for providing open-loop quadrature clock generation. The system is implemented by a ring oscillator structure that includes input inverters for receiving an input clock, forward direction loop inverters, backward direction loop inverters, one or more outputs, and cross-coupled latches connected between any two opposite nodes.

12 Claims, 12 Drawing Sheets

SYSTEM FOR PROVIDING OPEN-LOOP QUADRATURE CLOCK GENERATION

BACKGROUND OF THE INVENTION

This invention relates generally to clock generation, and more particularly to providing open-loop quadrature clock generation.

To address the ever-increasing need to increase the speed of computers and electronic appliances to process ever increasing amounts of data, designers have increased the clock frequency of computers and/or utilized parallel processing. Many electrical and computer applications and components have critical timing requirements that require clock waveforms that are precisely synchronized with a reference clock waveform.

One type of clock generator is a ring oscillator. Ring oscillators are widely used in electronic equipment such as computers, televisions, video-processing equipment and the like. Generally, a ring oscillator includes a single loop circuit that has an odd number of inverters. As the output signal is fed back into the inputs of the single direction loop, the output signal is inverted, resulting in a signal that varies between a high and a low signal. This creates a periodic signal with a well-defined and stable cycle.

Conventional main memory chips (e.g., a DDR II memory device) typically include a delay locked loop (DLL) to synchronize data timing to an external clock edge such as from a differential clock. As the data rate of memory devices increases, an exemplary clock may include a frequency multiplier within the memory devices, enabling data to be transferred at a rate of four (quad data rate, "QDR") or more bits per clock cycle. One way to provide such a frequency multiplier is to utilize a quadrature phase generating DLL that is more complicated than a conventional DLL, and therefore consumes more power to minimize jitter and ensure fast exit time (the time delay between exiting a low power state and normal device operation). Another manner of providing a frequency multiplier is to utilize a phase locked loop (PLL). However, PLLs have been known to suffer from jitter accumulation due to their loop architecture and to self-generate a frequency as well as a phase. In addition, the lock-in time of a PLL can be as much as ten times longer than a DLL. The PLL lock-in time is generally not compatible with memory circuit/chip requirements such as low standby power consumption and fast exit/availability time.

Therefore, it would be desirable to be able to generate quadrature (or octal, etc.) clock phases from differential (two phase) clocks in a manner that provides for a low level of jitter while consuming a relatively small amount of power.

BRIEF SUMMARY OF THE INVENTION

An embodiment includes a ring oscillator structure. The ring oscillator structure includes input inverters for receiving an input clock, forward direction loop inverters, backward direction loop inverters, one or more output nodes, and cross-coupled latches connected between any two opposite nodes.

Another embodiment includes an open-loop clock generating circuit. The open-loop clock generating circuit includes a coarse quadrature phase generating circuit for receiving a differential clock pair and for generating a coarse four phase clock. The open-loop clock generating circuit also includes one or more quadrature phase generating circuits in sequence for receiving the coarse four phase clock and for generating a four phase clock. Each of the quadrature phase generating circuits include forward direction loop inverters, backward direction loop inverters, and cross-coupled latches connected between any two opposite nodes and input inverters.

A further exemplary embodiment includes a memory system. The memory system includes a memory controller, a plurality of memory devices, a memory interface device and a ring oscillator structure. The memory interface device is in communication with the memory controller and the memory devices. The ring oscillator structure includes input inverters for receiving an input clock from one or more of the memory controller, the memory devices and the memory interface device. The ring oscillator structure also includes forward direction loop inverters, backward direction loop inverters, and one or more output nodes for outputting a multiple phase clock to one or more of the memory controller, the memory devices and the memory interface device. Cross-coupled latches are connected between any two opposite nodes in the ring oscillator structure.

Other systems, methods, and/or computer program products according to embodiments will be or become apparent to one with skill in the art upon review of the following drawings and detailed description. It is intended that all such additional systems, methods, and/or computer program products be included within this description, be within the scope of the present invention, and be protected by the accompanying claims.

BRIEF DESCRIPTION OF THE DRAWINGS

Referring now to the drawings wherein like elements are numbered alike in the several FIGURES.

DETAILED DESCRIPTION OF EXEMPLARY EMBODIMENTS

Figure 1:
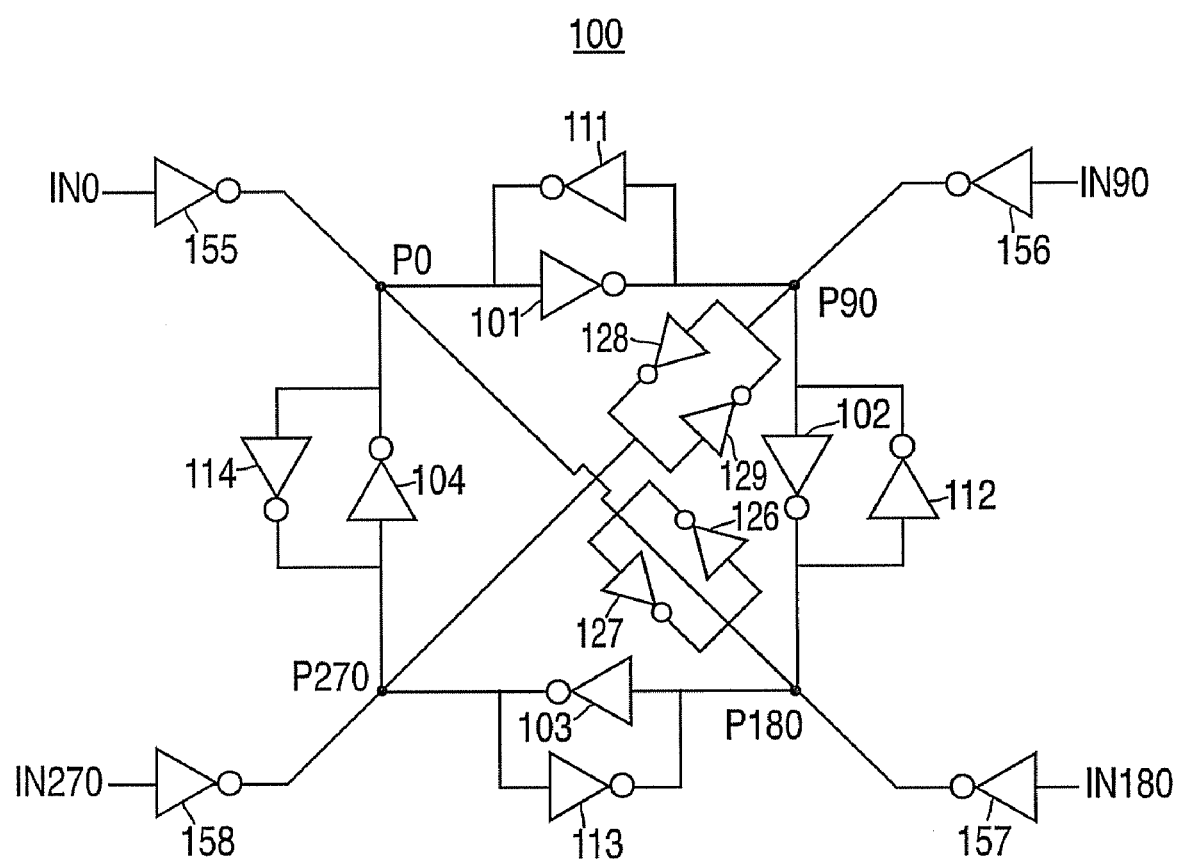
FIG. 1 depicts an exemplary quadrature phase regenerating stage which includes a backward 4-stage inverter ring oscillator loop that may be implemented by an exemplary embodiment.

An exemplary embodiment of the present invention provides a novel system for generating quadrature clocks from differential clock inputs. An exemplary embodiment utilizes one or more clock phase regenerating stages.

An exemplary embodiment is a circuit for generating coarse quadrature clock phases from a single differential input clock. The circuitry is comprised of a quadrature 4-stage inverter ring oscillator loop in addition to a backward 4-stage inverter ring oscillator loop, internal cross-coupled latches and input inverters. The resulting circuit generates quadrature clock phases that are accurate within a few degrees.

Another exemplary embodiment includes the coarse quadrature clock phase generation circuitry in conjunction with a quadrature phase regenerating stage. The quadrature phase regenerating stage is comprised of a quadrature 4-stage inverter ring oscillator loop in addition to a backward 4-stage inverter ring oscillator loop, internal cross-coupled latches and input inverters. This combined exemplary circuitry permits the construction of a low cost and fast locking solution for generating quadrature clock phases with an accuracy within a few degrees, while reducing phase error and input jitter on the output 4-phase clock.

In another exemplary embodiment, a level adjusting stage is added to the input of the coarse quadrature clock phase generation circuitry, in conjunction with a quadrature phase regenerating stage. The level-adjusting stage reduces the sensitivity of the exemplary open loop quadrature clock generating circuitry to variations in the input levels on the two signals comprising the single differential clock input.

Another exemplary embodiment includes an open loop octal phase generator, which is comprised of a common circuit structure as used in the quadrature clock generator. A yet further embodiment includes a twelve phase generator or other phase generator having a "2×n" relationship to the input clock, where "n" is an even integer, and which is comprised of a common circuit structure as used in the quadrature and octal clock generators.

Yet further exemplary embodiments include a memory device having an output data transfer rate of 4× (quad data rate), 8× (octal data rate) or another data transfer rate that is equal to the number of output clock phases (e.g. 4, 8, 12, 16, 24, 32, etc.) bits per each clock period, by a device comprising a coarse quadrature (or octal, etc.) phase generation circuitry in conjunction with a quadrature (or octal, etc.) phase regenerating stage.

Still further exemplary embodiments include a memory subsystem that includes at least one memory device having an output data transfer rate of 4× (quad data rate), 8× (octal data rate) or another data transfer rate that is equal to the number of output clock phases (e.g. 4, 8, 12, 16, 24, 32, etc.) bits per each clock period, by a device comprising a coarse quadrature (or octal, etc) phase generation circuitry in conjunction with a quadrature (or octal, etc) phase regenerating stage.

Still further exemplary embodiments include a memory system that includes a memory subsystem. The memory subsystem includes at least one memory device having an output data transfer rate of 4× (quad data rate), 8× (octal data rate) or another data transfer rate that is equal to the number of output clock phases (e.g. 4, 8, 12, 16, 24, 32, etc.) bits per each clock period, by a device comprising a coarse quadrature (or octal, etc) phase generation circuitry in conjunction with a quadrature (or octal, etc) phase regenerating stage.

FIG. 1 depicts an exemplary quadrature phase regenerating stage, comprised of a forward 4-stage inverter ring oscillator loop (101-104), a backward 4-stage inverter ring oscillator loop (111-114), internal cross coupled latches (126-129), and input inverters (155-158). When any input to the circuit is stimulated, it may or may not free-run depending upon the relative strength (e.g. device sizes) of the forward (101-104) and backward (111-114) inverters. If the forward and backward inverters have equal strength, the circuit does not oscillate by itself. If the forward path is stronger (e.g., built with larger device sizes), the circuit will oscillate at a certain frequency, with the frequency depending on the relative strength of the forward and backward paths.

When the inputs "IN0", IN90", IN180" and "IN270" are stimulated with 4 clock phases, the 4 output nodes (P0-P270) follow the input frequency even though the input frequency is different from the circuit's free-running frequency. This happens because the circuit has variable loop delay depending upon the phase difference between input nodes and internal nodes (P0-P270). For example, the three inverters 101, 104 and 155 form a phase interpolator. If the phase of IN0 leads the phase of P270, the effective delay from P270 to P0 is be decreased. If the phase of IN0 lags the phase of P270, the effective delay from P270 to P0 is increased. Therefore, when inputs are stimulated with a certain frequency, the phase difference between IN0 and P270 is automatically set such that the loop turn-around delay becomes the operating frequency.

Figure 2:
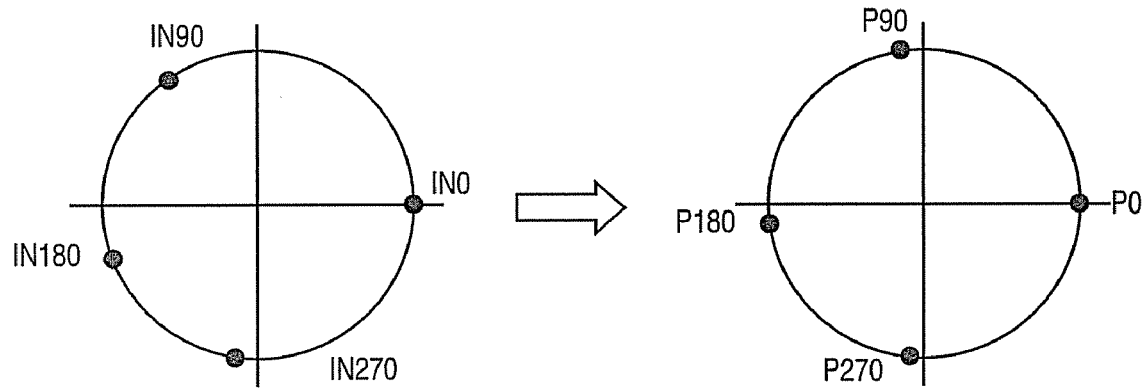
FIG. 2 depicts an example of the relative phases of the input clocks and the output clocks associated with the exemplary quadrature phase regenerating stage depicted in FIG. 1.

Moreover, the exemplary circuit depicted in FIG. 1 has at least two advantageous characteristics. One advantageous characteristic is that if there is some amount of phase error across the input quadrature phases, the phase error is reduced at the output nodes. This is due to the fact that all output phases tend to push out one another due to the latches located between any two nodes. FIG. 2 shows an example of this characteristic.

Another advantageous characteristic of the exemplary circuit depicted in FIG. 1 is that if there is some amount of jitter in the input clock edges, that jitter is reduced at the output nodes. Since the circuit will be oscillating with the same frequency as that of the input clocks, the output edges are a result of phase interpolation between the output edge(s) and the input edge(s). Therefore, output edge jitter is averaged out by the circuit.

The exemplary embodiment depicted in FIG. 1 includes the novel addition of a backward path (inverters 111, 112, 113 and 114) to the ring oscillator. The backward path makes the frequency range (ratio of maximum frequency to minimum frequency where above-mentioned characteristics are preserved) higher than six. Typically, ring oscillators with a single direction (e.g., a forward path) have a frequency range limited to two. By having the backward path, the circuit behaves much differently than a typical single direction circuit and can support a large frequency range (e.g., a range such as 2-6 gigahertz can be supported).

Figure 3:
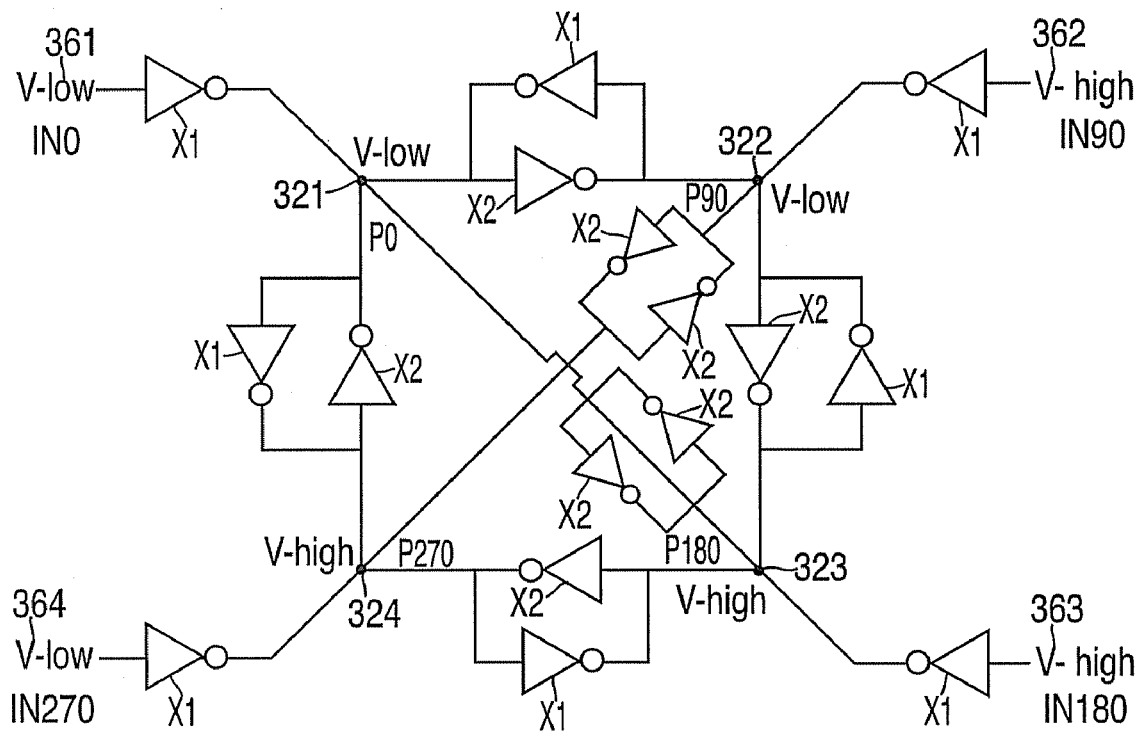
FIG. 3 depicts the instantaneous node voltages of the circuit in FIG. 1, at a certain time, in addition to identifying the exemplary inverter strengths.
Figure 4:
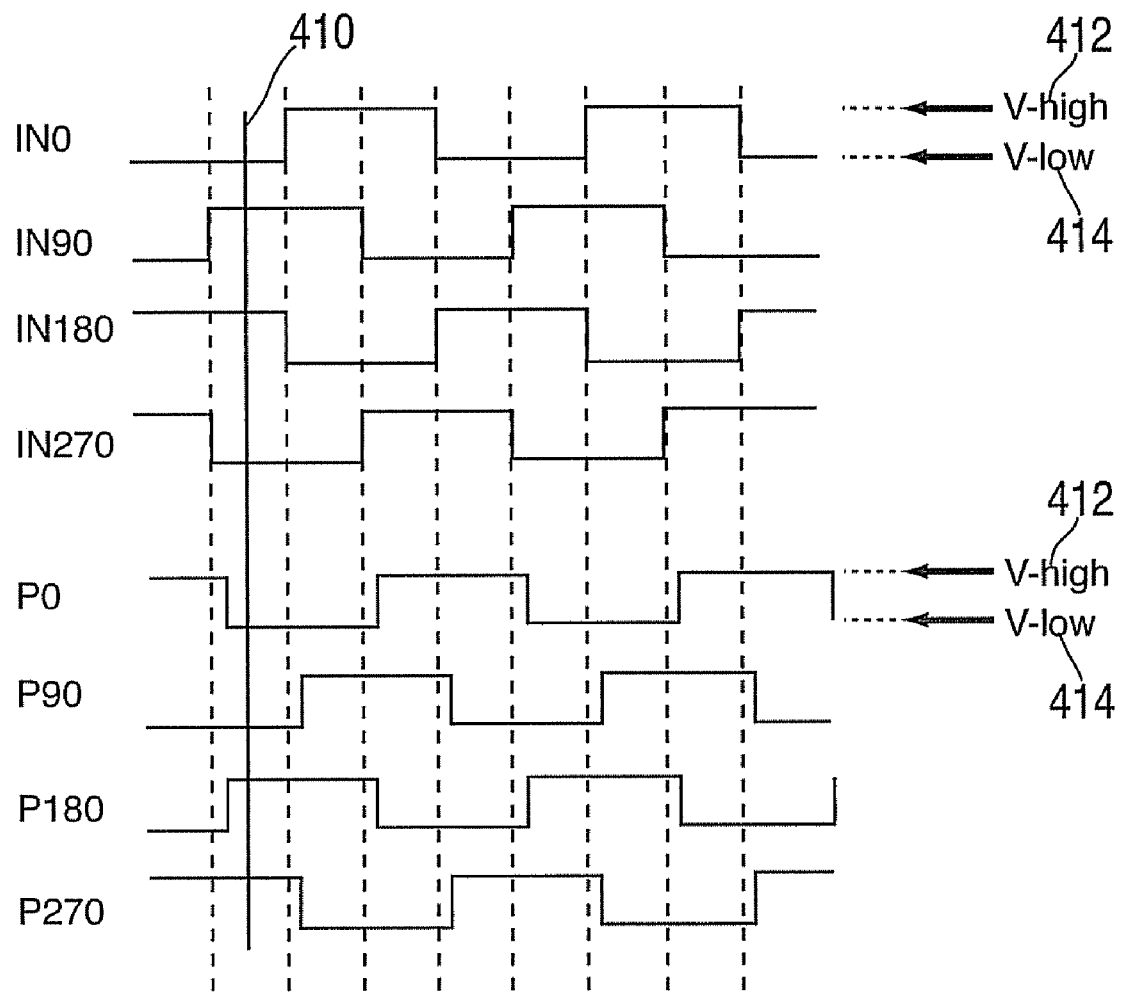
FIG. 4 depicts a timing diagram for the four phases of the input clock and output clock of an exemplary quadrature phase regenerating stage.

FIG. 3 depicts the instantaneous node voltages of the circuit in FIG. 1, at a certain time, in addition to identifying the exemplary inverter strengths. FIG. 4 depicts a timing diagram for the four phases of the input clock and output clock of the circuit in FIG. 1. FIG. 4 depicts instantaneous node voltages "V-high" 412 and "V-low" 414 of the circuit at a time which is denoted as the solid vertical line 410 in FIG. 4. It should be noted that outputs 321-324 have a 90 degree phase difference from inputs 361-364 in FIG. 3. This is a result of the backward inverters within the loop. In the example shown by FIG. 4 in conjunction with FIG. 3, the voltage of output P90 (322) remains at V-low (a certain voltage between ground and half of supply voltage VDD, with the voltage value varying for different inverter device sizing), because there are device strengths totaling 4× (comprised of x2 device from 324 plus x1 device from 323 plus x1 device from 362, totaling 4×) forcing it to 'low' whereas there is a device strength of only 2× (a single x2 inverter from 321 to 322) forcing the output to 'high'.

Since phases of the input and output nodes differ by 90 degrees as shown in FIG. 4, the state transition of the input signals (e.g. IN0, IN90, etc) does not affect the corresponding outputs (e.g. P0, P90, etc), but instead, the state transitions affect the other two nodes for which phases are 90 degrees apart. For example, when IN0 (361) and IN180 (363) change state, P90 and P270 (not P0 and P180) will change state as shown in FIG. 4. This situation occurs also at very low frequencies, which means that the circuit has an inherent quadratic (90 degree) nature. Further, input node phases affect output nodes which are one inverter stage away from their directly connected output node. This means that there is more delay range that input signals can modify. At the minimum frequency, input phases lag output phases. Without the backward path, the circuit loses its interpolating nature beyond the point where IN0 would lag P0. With the inclusion of the backward path, the circuit can continue to operate until IN0 lags P90. As a result, the exemplary circuit has a very wide frequency range.

Figure 5:
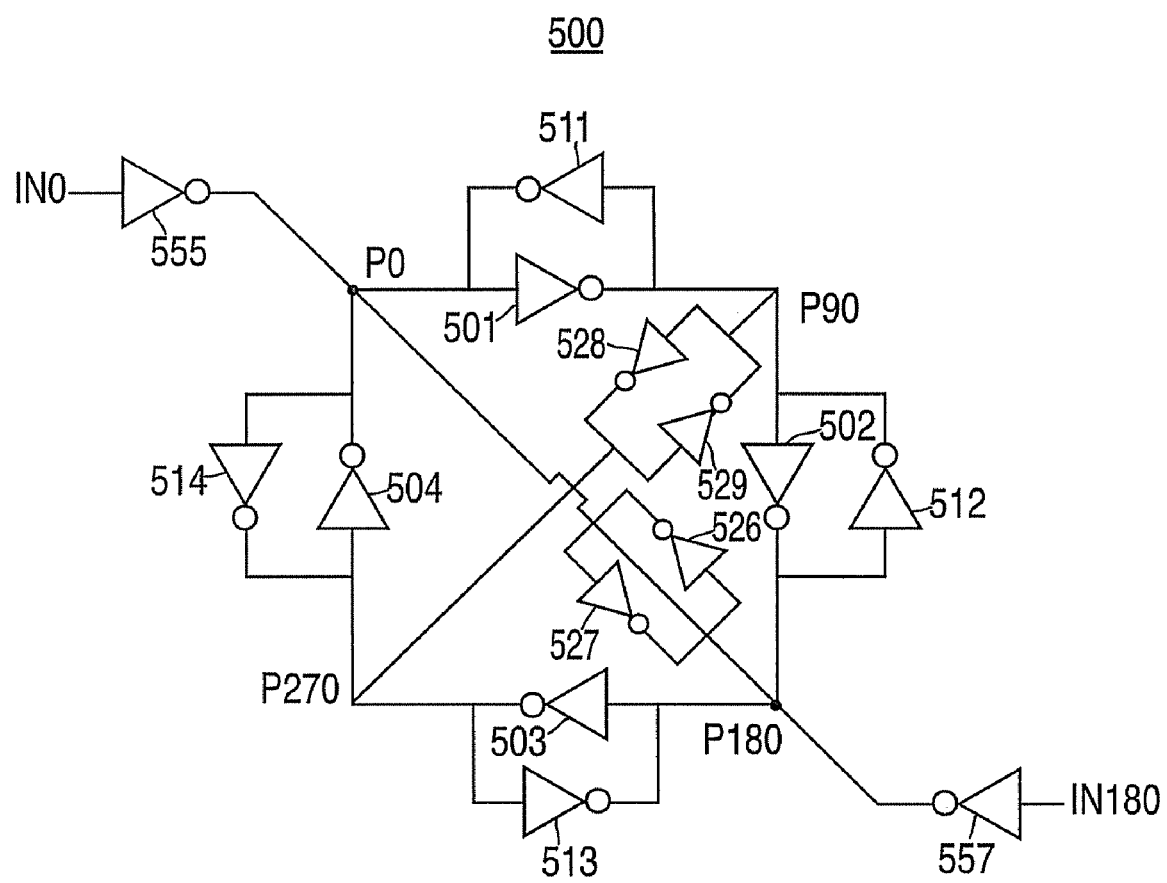
FIG. 5 depicts an exemplary circuit to generate coarse quadrature clock phases from a differential (e.g. 2 phase) input clock.

The above teachings are based upon the assumption that four input phases are presently available, although the circuit would permit the four input phases to have a phase error of more than 45 degrees. FIG. 5 is an exemplary circuit to generate coarse quadrature clock phases from differential input clock phases. FIG. 5 includes a forward 4-stage inverter ring oscillator loop (501-504), a backward 4-stage inverter ring oscillator loop (511-514), internal cross coupled latches (526-529), and input inverters (555 and 557). When any input to the circuit is stimulated, it may or may not free-run depending upon the relative strength (e.g. device sizes) of the forward (501-504) and backward (511-514) inverters.

The circuit depicted in FIG. 5 has been derived from the exemplary circuit structure shown in FIG. 1, but with two input inverters (for P90 and P270) removed. In the exemplary embodiment depicted in FIG. 5, the removed inverters are added to the internal cross coupled latch (devices 528 and 529) to balance the drive strength uniformity among the four nodes. This exemplary circuit generates quadrature phases with an accuracy of within a few degrees. To increase the phase accuracy, one or more stages can be cascaded at the outputs of this circuit.

Figure 6:
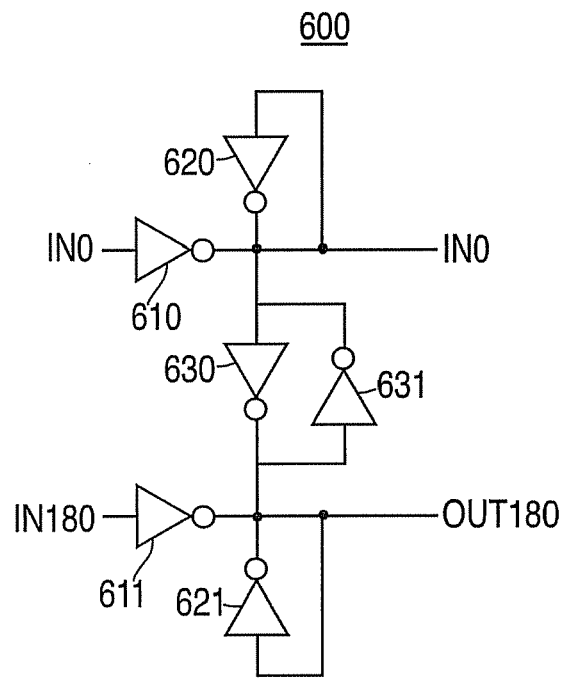
FIG. 6 depicts an exemplary input level adjusting stage, as derived from the exemplary circuit shown in FIG. 5.

Moreover, the performance of the circuit shown in FIG. 5 can be enhanced when an input level adjusting stage is cascaded before this circuit. The level adjusting stage ensures that the voltage levels on the differential inputs have the same value of V-low and V-high (relative to VDD), thereby ensuring that the input and output states satisfy the conditions shown in FIG. 3. An exemplary input level adjusting circuit is shown in FIG. 6. The derivation of this exemplary circuit can be accomplished by simplifying the circuit diagram shown in FIG. 3. It can be observed that V-low and V-high are connected each other through 2× latches (e.g. the x2 cross-coupled inverter device pair connected between 321 and 323 in FIG. 3) and each node is tied with 1× inverters. Although FIG. 6 shows an exemplary version for the implementation of a level-adjusting stage, other implementations may also exist. In an exemplary embodiment of FIG. 6, derived from FIG. 3, inverters 610 and 611 have a x2 device size (i.e. having twice the drive strength of an x1 device) device size, inverters 620 and 621 have device sizes of x3 and inverters 630 and 631 have device sizes of x7.

Figure 7:
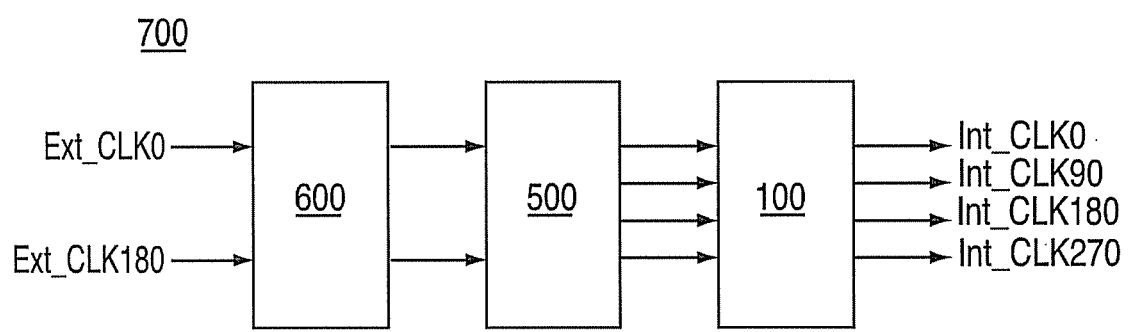
FIG. 7 is a block diagram of an exemplary open loop quadrature clock generating circuit that may be implemented by an exemplary embodiment.

FIG. 7 depicts shows the full block diagram of the open-loop quadrature clock generating circuit (CGC) 700, comprised of the exemplary input level adjusting circuit 600 depicted in FIG. 6 coupled to the exemplary coarse quadrature clock phase circuit 500 depicted n FIG. 5, which is coupled to the exemplary quadrature phase regenerating circuit 100 depicted in FIG. 1. The quadrature phase regenerating circuit 100 may be applied multiple times depending on the required degree of phase accuracy, with the phase accuracy increasing with each application. As described previously, a differential clock pair (Ext_CLK0 and Ext_CLK180) are input to the input level adjusting circuit 600, and may be sourced by circuitry such as a memory command interface block 1308 in hub 1214 via a differential clock pair 1350.

Figure 8:
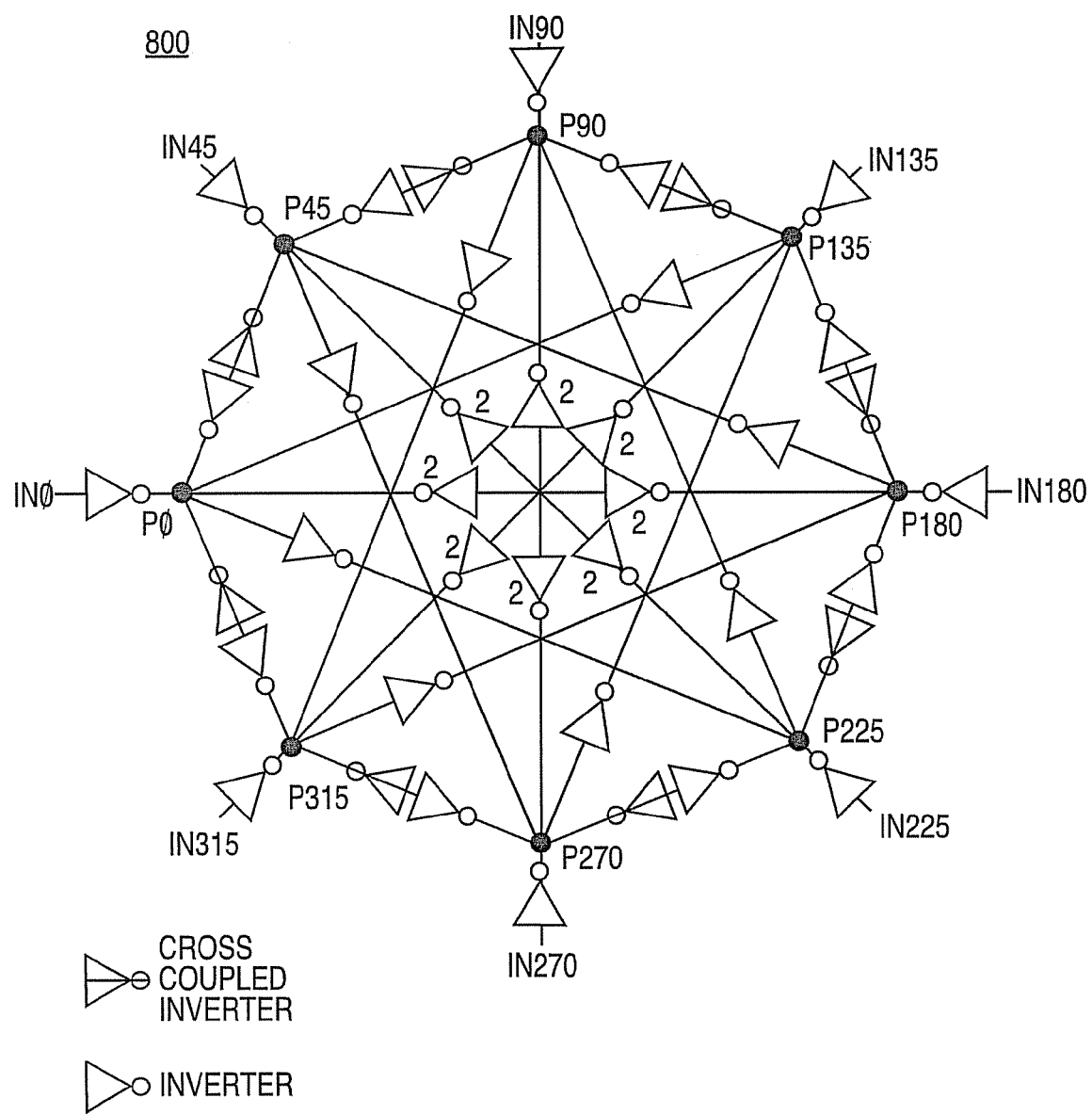
FIG. 8 depicts an exemplary octal phase regenerating stage, which is consistent with the quadrature phase regenerating stage depicted in FIG. 1.

FIG. 8 shows an exemplary octal (8) phase clock generator 800 that may be implemented by exemplary embodiments of the present invention. The octal phase clock generator 800 depicted in FIG. 8 has been extended from the 4 phases of FIG. 1 to 8 phases. The simplified figure of the octal phase clock generator 800 includes cross-coupled inverters between each adjacent output (separated by 45 degrees) as well as 2× latches (e.g. the x2 cross-coupled inverters) between each pair of outputs 180 degrees apart and a single inverter between each pair of outputs 135 degrees apart.

Figure 9:
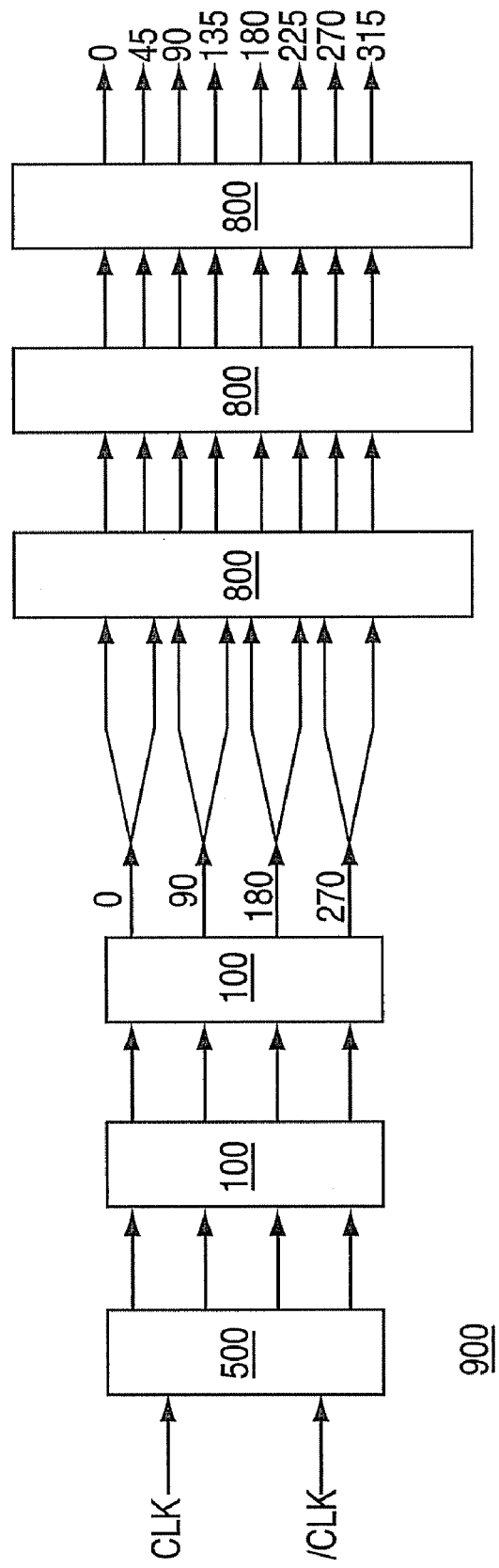
FIG. 9 is a block diagram of an exemplary open loop octal clock generating circuit that may be implemented by an exemplary embodiment.

FIG. 9 depicts shows the full block diagram of the open-loop octal clock generating circuit 900, comprised of the exemplary coarse quadrature clock phase circuit 500 depicted n FIG. 5, coupled to the exemplary quadrature phase regenerating circuit 100 depicted in FIG. 1, which is coupled to the octal phase clock generator 800 depicted in FIG. 8. As depicted in FIG. 9, the quadrature phase regenerating circuit 100 may be applied one or more times depending on the required degree of phase accuracy, with the phase accuracy increasing with each application. In addition, the octal phase clock generator 800 may be applied one or more times, again depending on the required degree of phase accuracy. In addition, the exemplary input level adjusting circuit 600 depicted in FIG. 6 may be applied prior to the coarse quadrature clock phase circuit 500. A differential clock pair (CLK and /CLIK) are input to the open-loop octal clock generating circuit 900 depicted in FIG. 9, and may be sourced by circuitry such as memory command interface 1308 via a differential clock pair 1350.

Figure 10:
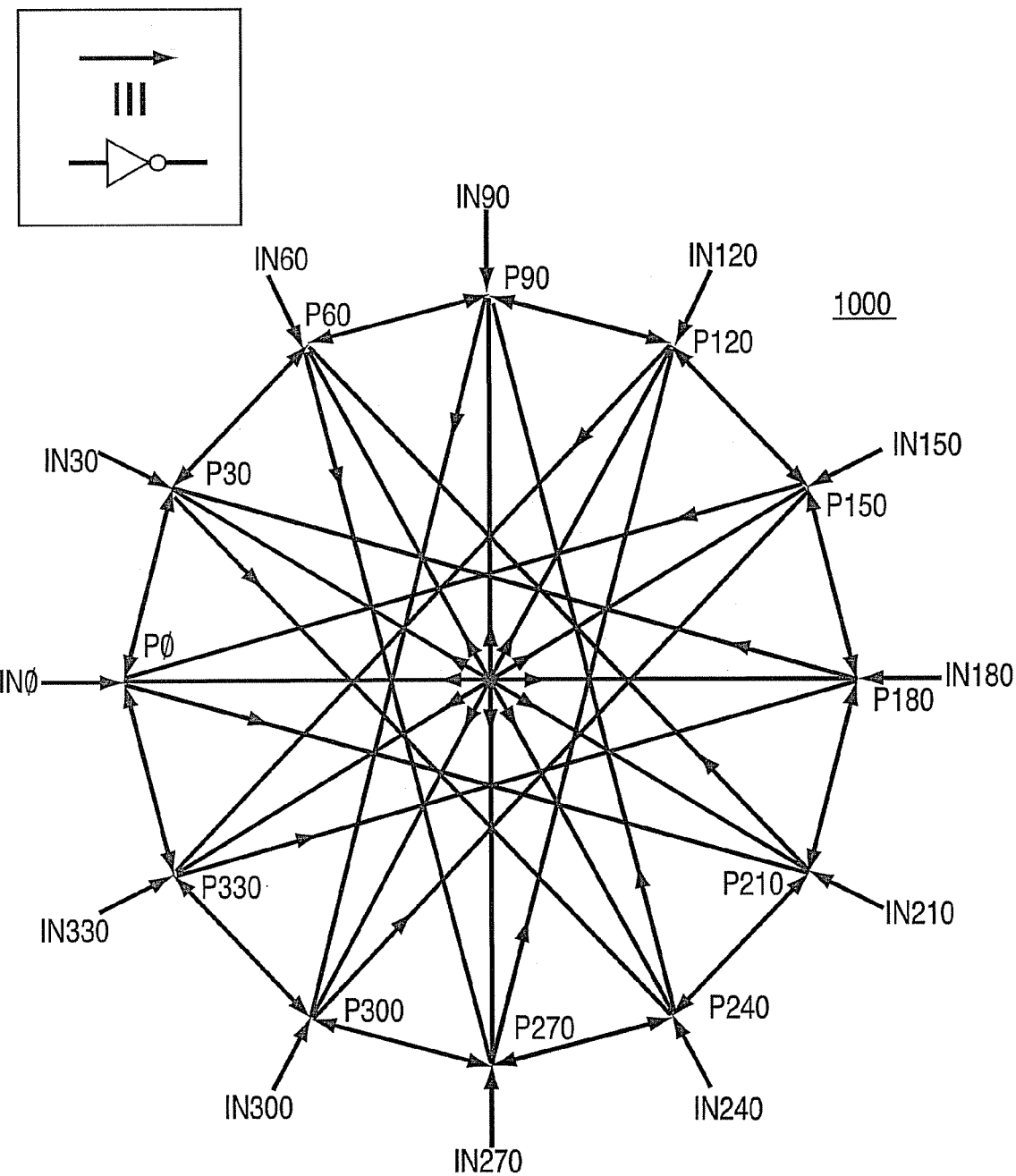
FIG. 10 depicts an exemplary twelve phase regenerating stage, which is consistent with the quadrature phase regenerating stage depicted in FIG. 1.

FIG. 10 shows an exemplary twelve phase clock generator circuit that may be implemented by exemplary embodiments of the present invention. The twelve phase clock generator 1000 depicted in FIG. 10 has been extended from the 4 phases of FIG. 1 to 12 phases. The simplified figure of the twelve phase clock generator 1000 includes cross-coupled inverters between each adjacent output (separated by 30 degrees) as well as 2× latches (e.g. the x2 cross-coupled inverters) between each pair of outputs 180 degrees apart and a single inverter between each pair of outputs 150 degrees apart.

Figure 11:
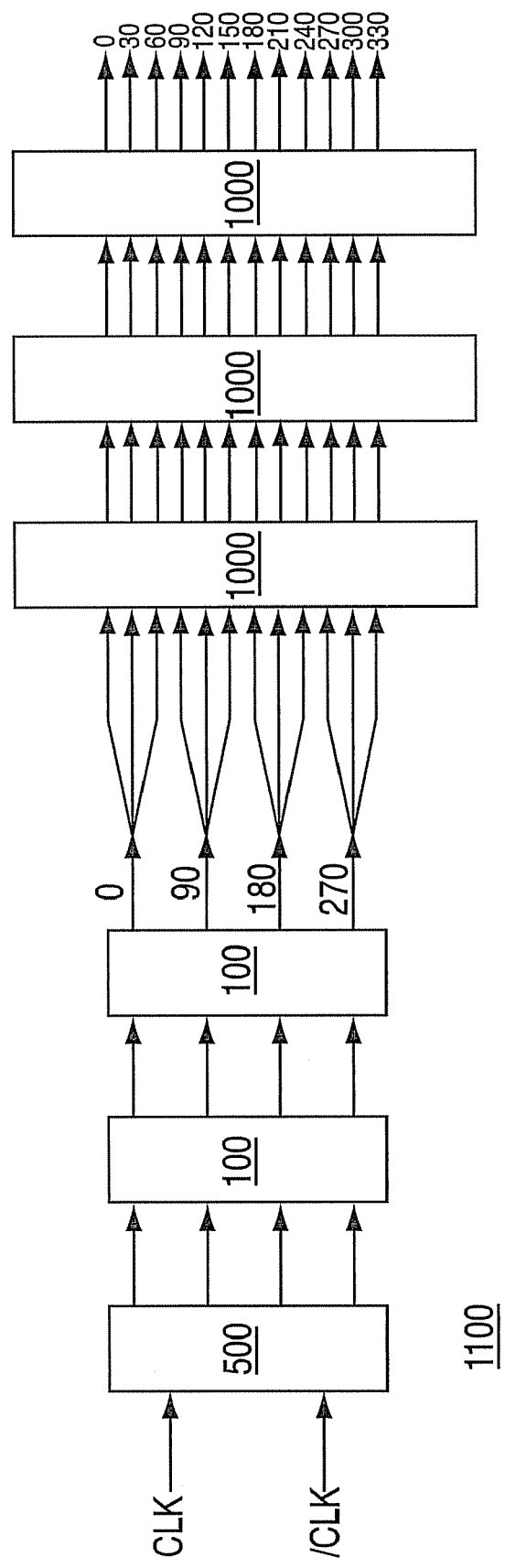
FIG. 11 is a block diagram of an exemplary open loop twelve phase clock generating circuit that may be implemented by an exemplary embodiment.

FIG. 11 depicts shows the full block diagram of the open-loop twelve clock generating circuit 1100, comprised of the exemplary coarse quadrature clock phase circuit 500 depicted n FIG. 5, coupled to the exemplary quadrature phase regenerating circuit 100 depicted in FIG. 1, which is coupled to the twelve phase clock generator 1000 depicted in FIG. 10. As depicted in FIG. 11, the quadrature phase regenerating circuit 100 may be applied one or more times depending on the required degree of phase accuracy, with the phase accuracy increasing with each application. In addition, the twelve phase clock generator 1000 may be applied one or more times, again depending on the required degree of phase accuracy. In addition, the exemplary input level adjusting circuit 600 depicted in FIG. 6 may be applied prior to the coarse quadrature clock phase circuit 500. A differential clock pair (CLK and /CLK) are input to the open-loop twelve clock generating circuit 1100 depicted in FIG. 1, and may be sourced by circuitry such as memory command interface 1308 via a differential clock pair 1350.

Figure 12:
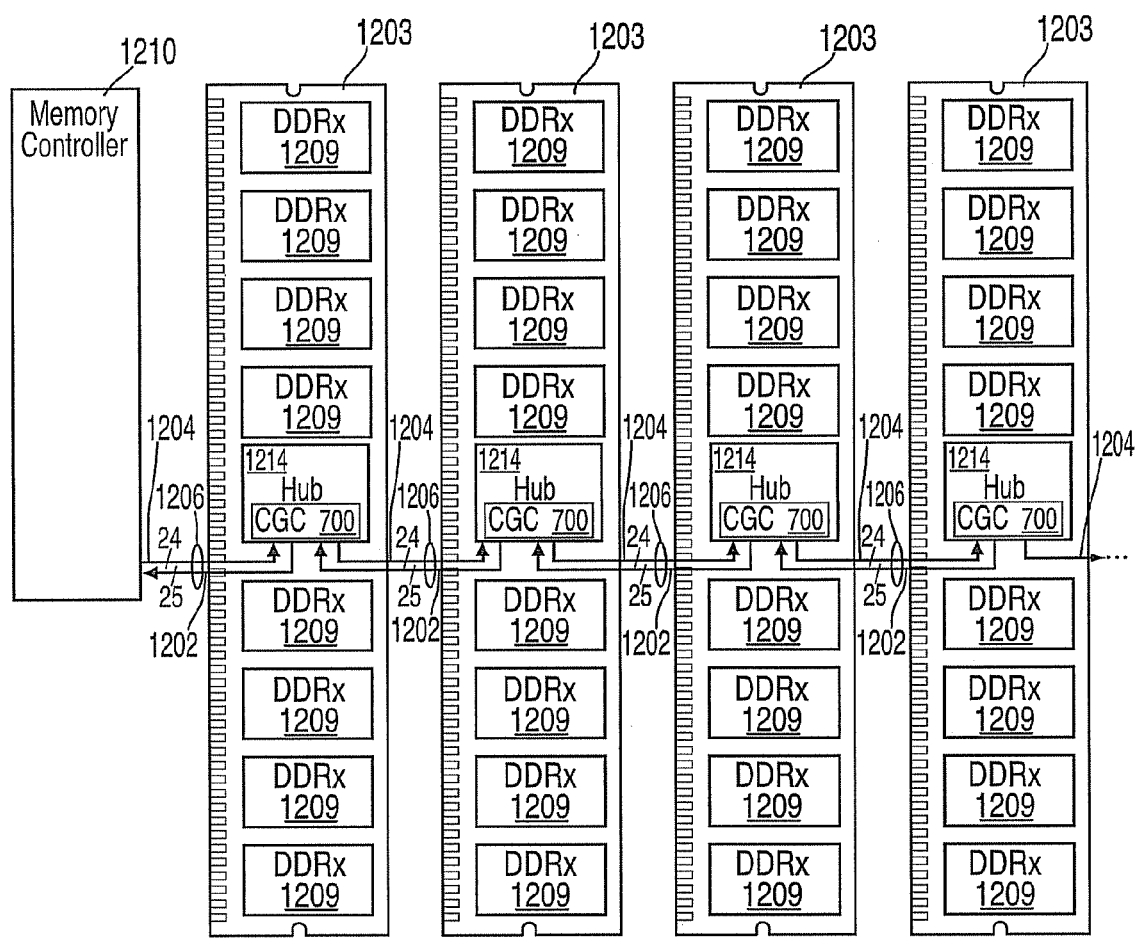
FIG. 12 depicts a memory structure that may be implemented by exemplary embodiments.

FIG. 12 depicts a memory structure with cascaded memory modules 1203, high speed DDRx (x=a future DDR device configuration) memory devices 1209, a hub device 1214 and unidirectional busses 1206 that may be implemented by exemplary embodiments. The unidirectional busses 1206 include an upstream memory bus 1202 and a downstream memory bus 1204. The hub device 1214 includes an open-loop quadrature clock generating circuit 700 for developing 4 phase clock signals from differential clock(s) extracted from the downstream bus 1206. The open-loop quadrature clock generating circuit 700 may be replaced in the hub device 1214 by one or more of an octal clock generating circuit 900 or the open-loop twelve clock generating circuit 1100 or another open-loop clock generating circuit. The quadrature (e.g. 4 phase) clock signals developed in hub device 1214 would each connect to one or more DDRx memory devices 1209, providing a high speed memory clock consistent with the operation of a DDRx memory device which transfers data on each edge of an externally supplied quadrature clock (e.g. 4 data transfers per full 360 degree clock period).

Figure 13:
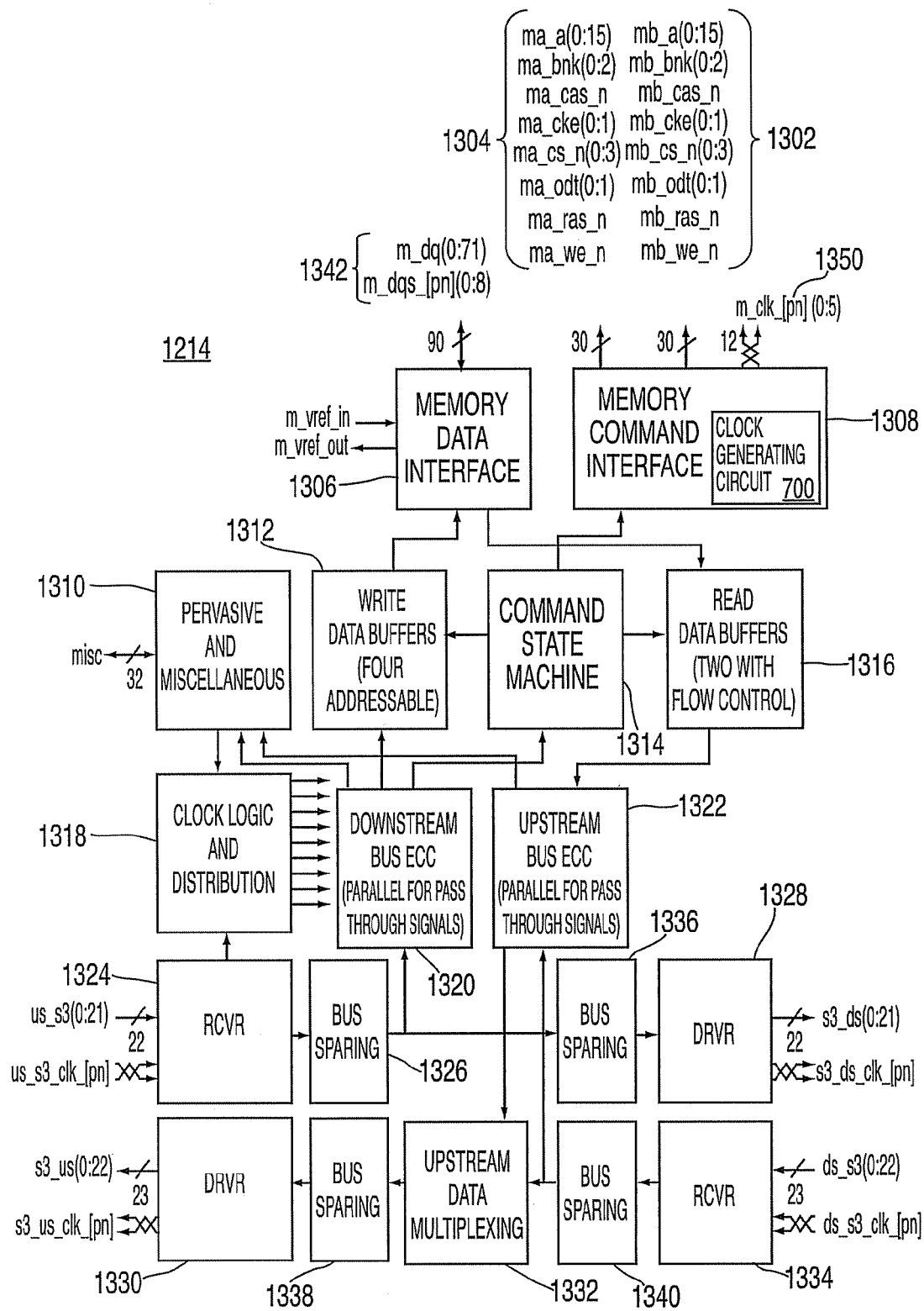
FIG. 13 is a block diagram of the high-level logic flow of the hub device located on a memory module in exemplary embodiments.

FIG. 13 is a block diagram of the high-level logic flow of a hub device 1214 located on a memory module 1203 that may be implemented by exemplary embodiments. In an exemplary embodiment, the open-loop quadrature clock generating circuit 700 is located in the memory command interface block 1308 in the hub device 1214. The blocks in the lower left and right portions of the drawing (1324, 1328, 1330, 1334) are associated with receiving or driving the high-speed bus 1206 depicted in FIG. 12. The upstream bus 1202 passes information in the direction of the memory controller 1210, and the downstream bus 1206 passes information away from the memory controller 1210.

Referring to FIG. 13, data, command, address, ECC, and clock signals from an upstream memory assembly (i.e., a memory module 1203) or a memory controller 1210 are received from the downstream memory bus 1204 into a receiver module 1324. The receiver functional block 1324 provides macros and support logic for the downstream memory bus 1204 and, in an exemplary embodiment of the present invention includes support for a twenty-two bit, high speed, slave receiver bus. The receiver functional block 1324 transmits the clock signals to a clock logic and distribution functional block 1318 (e.g., to generate the four to one clock signals). The clock logic and distribution functional block 1318 also receives data input from the pervasive and miscellaneous signals 1310. These signals typically include control and setup information for the clock distribution PLL's, test inputs for BIST (built-in self-test) modes, programmable timing settings, etc. The receiver functional block 1324 transfers the data, command, ECC and address signals to a bus sparing logic block 1326 to reposition, when applicable, the bit placement of the data in the event that a spare wire utilized during the transmission from the previous memory assembly. In an exemplary embodiment of the present invention, the bus sparing logic block 1326 is implemented by a multiplexer to shift the signal positions, if needed. Next, the original or re-ordered signals are input to another bus sparing logic block 1336 to modify, or reorder if necessary, the signal placement to account for any defective interconnect that may exist between the current memory assembly and a downstream memory assembly. The original or re-ordered signals are then input to a driver functional block 1328 for transmission, via the downstream memory bus 1204, to the next memory module 1203 in the chain. In an exemplary embodiment of the present invention, the bus sparing logic 1336 is implemented using a multiplexer. The driver functional block 1328 provides macros and support logic for the downstream memory bus 1204 and, in an exemplary embodiment of the present invention, includes support for the twenty-two bit, high speed, low latency cascade bus drivers.

In addition to inputting the original or re-ordered signals to the bus sparing logic 1336, the bus sparing logic 1326 also inputs the original or re-ordered signals into a downstream bus ECC functional block 1320 to perform error detection and correction for the frame. The downstream bus ECC functional block 1320 operates on any information received or passed through the hub device 1214 from the downstream memory bus 1204 to determine if a bus error is present. The downstream bus ECC functional block 1320 analyzes the bus signals to determine if it they are valid. Next, the downstream bus ECC functional block 1320 transfers the corrected signals to a command state machine 1314. The command state machine 1314 inputs the error flags associated with command decodes or conflicts to a pervasive and miscellaneous functional block 1310. The downstream and upstream modules also present error flags and/or error data (if any) to the pervasive and miscellaneous functional block 1310 to enable reporting of these errors to the memory controller, processor, service processor or other error management unit.

Referring to FIG. 13, the pervasive and miscellaneous functional block 1310 transmits error flags and/or error data to the memory controller 1210. By collecting error flags and/or error data from each memory module 1203 in the chain, the memory controller 1210 will be able to identify the failing segment(s), without having to initiate further diagnostics, though additional diagnostics may be completed in some embodiments of the design. In addition, once an installation selected threshold (e.g., one, two, ten, or twenty) for the number of failures or type of failures has been reached, the pervasive and miscellaneous functional block 1310, generally in response to inputs from the memory controller 1210, may substitute the spare wire for the segment that is failing. In an exemplary embodiment of the present invention, error detection and correction is performed for every group of four transfers, thereby permitting operations to be decoded and initiated after half of the eight transfers, comprising a frame, are received. The error detection and correction is performed for all signals that pass through the memory module 1203 from the downstream memory bus 1204, regardless of whether the signals are to be processed by the particular memory module 1203. The data bits from the corrected signals are input to the write data buffers 1312 by the downstream bus ECC functional block 1320.

The command state machine 1314 also determines if the corrected signals (including data, command and address signals) are directed to and should be processed by the memory module 1203. If the corrected signals are directed to the memory module 1203, then the command state machine 1314 determines what actions to take and may initiate DRAM action, write buffer actions, read buffer actions or a combination thereof. Depending on the type of memory module 1203 (buffered, unbuffered, registered), the command state machine 1314 selects the appropriate drive characteristics, timings and timing relationships. The write data buffers 1312 transmit the data signals to a memory data interface 1306 and the command state machine 1314 transmits the associated addresses and command signals to a memory command interface 1308, consistent with the specification for the memory module type (buffered, unbuffered, registered), such as the exemplary prior generation DIMM described herein.

The memory command interface 1308 includes programmable timing circuitry to enable memory device timings to be met whether the devices are directly attached to the hub, or attached indirectly via one or more modules connected to the hub/adapter assembly as described herein and in U.S. Patent Publication Number U.S. 2006/0136618A1 to Gower et al., of common assignment herewith and incorporated herein by reference in its entirety. Unbuffered memory modules, which do not include re-drive or address, control and/or command data, will generally be operated with timings similar to those of direct-attached memory devices; however drive strengths on the memory command interface 1308 may be adjusted, as well as timing relationships between signals and/or signal groupings, based on the unbuffered module type (e.g. the memory device count). Registered memory modules generally include re-drive on one or more of address, control and command signals (shown as two sets of signals, 1302 and 1304, to enable connection to one or two independent memory busses, modules or memory ranks), thereby generally requiring a lower drive strength from the memory command interface 1308, but may require a shift in one or more of the address, control and command timings relative to data due to the re-drive delay on these one or more signals on the registered DIMM.

The memory command interface 1308, therefore, includes one or more of additional programmable drive strength, terminations, programmable timings (signal output times relative to clock) and clock relationships (signals may be sent on different clock boundaries) such that a wide range of memory device attachment methods (directly and indirectly attached to the command interface) can be supported. The memory clocks are also forwarded to the attached memory devices and/or modules via the 6 differential clock pairs (12 wires) 1350 from the memory command interface 1308, thereby enabling the memory command interface 1308 to correctly reference all output signals to the memory (and memory register) clocks in systems using QDR memory devices such as described in FIG.14. The memory command interface 1308 may output differential clocks (as shown in FIG. 13) or may include clock generating circuitry 700, 900, 1100 or other exemplary clock generating circuitry to enable the memory command interface 1308 to generate multi-phase clocks from a differential clock. With the inclusion of quadrature clock generating circuit 700 in hub 1214 of FIG. 13, the exemplary hub would be limited to driving 3 clock groups due to the 12 clock pins as shown in FIG. 13. Further exemplary embodiments would include additional clock pins on hub 1214, enabling memory command interface 1308 to develop and drive two, three, four or more groups of quadrature, octal of other multi-phase clocks from a differential input clock or a multi-phase input clock having ½, ⅓, etc the phases of the output clock. In addition, an exemplary version of hub 1214 might further include multiple clock generating circuits, including selection circuitry to enable operation of the hub with memory and/or other devices requiring 2, 4, 8, 12 or more clock phases.

Similarly, the memory data interface 1306 reads from and writes memory data 1342 to directly attached memory device(s) 1209 and/or to one or more memory modules 1203. As with the memory command interface 1308, the memory data interface 1306 includes one or more of programmable drive strength, terminations, programmable timings (signal output times relative to clock) and clock relationships (signals may be sent on different clock boundaries, relative to the clocks sourced from memory command interface 1308) such that a wide range of memory device attachment methods (directly and indirectly attached to the command interface) can be supported. With the exemplary interface programmability included in the memory data interface 1306 and memory command interface 1308, the exemplary hub device 1214 offers a single device and/or package solution which can be used on a module as part of a memory subsystem, on an adapter card to connect to one or more attached memory modules, as an interface device (on a system board or card) to adapt a packetized, multi-transfer interface to an alternate parallel interface, such as a multi-drop, fly-by or other memory interface, etc.

Data signals to be transmitted to the memory controller 1210 may be temporarily stored in the read data buffers 1316 after a command, such as a read command, has been executed by the memory module 1203, consistent with the memory device 'read' timings. The read data buffers 1316 transfer the read data into an upstream bus ECC functional block 1322. The upstream bus ECC functional block 1322 generates check bits for the signals in the read data buffers 1316. The check bits and signals from the read data buffers 1316 are input to the upstream data multiplexing functional block 1332. The upstream data multiplexing functional block 1332 merges the data on to the upstream memory bus 1202 via the bus sparing logic 1338 and the driver functional block 1330. If needed, the bus sparing logic 1338 may re-direct the signals to account for a defective segment between the current memory module 1203 and the upstream receiving module (or memory controller). The driver functional block 1330 transmits the original or re-ordered signals, via the upstream memory bus 1202, to the next memory assembly (i.e., memory module 1203) or memory controller 1210 in the chain. In an exemplary embodiment of the present invention, the bus sparing logic 1338 is implemented using a multiplexer to shift the signals. The driver functional block 1330 provides macros and support logic for the upstream memory bus 1202 and, in an exemplary embodiment of the present invention, includes support for a twenty-three bit, high speed, low latency cascade driver bus.

Data, clock and ECC signals from the upstream memory bus 1202 are also received by any upstream hub device 1214 in any upstream memory module 1203. These signals need to be passed upstream to the next memory module 1203 or to the memory controller 1210. Referring to FIG. 13, data, ECC and clock signals from a downstream memory assembly (i.e., a memory module 1203) are received on the upstream memory bus 1202 into a receiver functional block 1334. The receiver functional block 1334 provides macros and support logic for the upstream memory bus 1202 and, in an exemplary embodiment of the present invention includes support for a twenty-three bit, high speed, slave receiver bus. The receiver functional block 1334 passes the data and ECC signals, through the bus sparing functional block 1340, to the upstream data multiplexing functional block 1332 and then to the bus sparing logic block 1338. The signals are transmitted to the upstream memory bus 1202 via the driver functional block 1330.

In addition to passing the data and ECC signals to the upstream data multiplexing functional block 1332, the bus sparing functional block 1340 also inputs the original or re-ordered data and ECC signals to the upstream bus ECC functional block 1322 to perform error detection and correction for the frame. The upstream bus ECC functional block 1322 operates on any information received or passed through the hub device 1214 from the upstream memory bus 1202 to determine if a bus error is present. The upstream bus ECC functional block 1322 analyzes the data and ECC signals to determine if they are valid. Next, the upstream bus ECC functional block 1322 transfers any error flags and/or error data to the pervasive and miscellaneous functional block 1310 for transmission to the memory controller 1210. In addition, once a pre-defined threshold for the number or type of failures has been reached, the pervasive and miscellaneous functional block 1310, generally in response to direction of the memory controller 1210, may substitute the spare segment for a failing segment.

The block diagram in FIG. 13 is one implementation of a hub device 1214 that may be utilized by exemplary embodiments of the present invention. Other implementations are possible without departing from the scope of the present invention.

Figure 14:
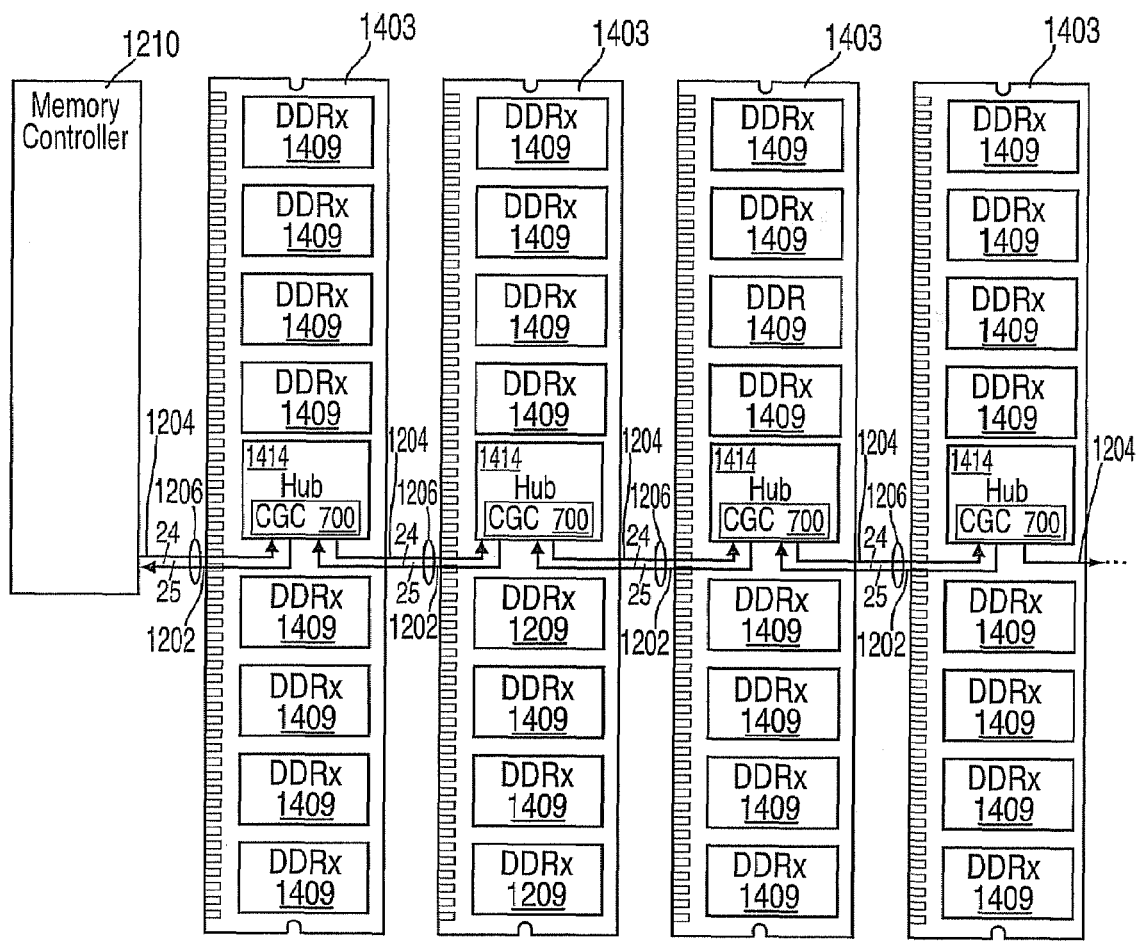
FIG. 14 depicts a memory structure that may be implemented by exemplary embodiments.

FIG. 14 depicts a memory structure with cascaded memory modules 1403, high speed QDR (Quad Data Rate) memory devices 1409, hub device 1414 and unidirectional busses 1206 that may be implemented by exemplary embodiments. The unidirectional busses 1206 include an upstream memory bus 1202 and a downstream memory bus 1204. The one or more memory devices 1409 include an open-loop quadrature clock generating circuit 700 which develops a four-phase clock from a received differential clock 1350 to clock input and output registers on the memory device 1409. In an exemplary embodiment, the input and output register structure is consistent with contemporary DDR memory devices 1409, except that the register structure includes 2+the data storage and is operable with a 4-phase clock such that data can be transferred (e.g. written or read) at a rate of 4 times per 360 degree clock period, as compared to 2 times per 360 degree clock period for contemporary DDR devices. The open-loop quadrature clock generating circuit 700 may be replaced in the memory device(s) 1409 by one or more of the octal clock generating circuit 900 or the open-loop twelve clock generating circuit 1100 or another open-loop clock generating circuit, with these new memory devices including further output register modifications, enabling the transfer of 8 or 12 bits per 360 degree clock cycle respectively. By developing the quadrature clock signals internal to the memory devices, difficulties associated with the distribution and shielding of multiple clocks operating at a 2× higher clock frequency (e.g. the clock frequency required to achieve the same data rate using DDR devices) are eliminated, while retaining the benefits of low clock power, minimal start-up time when exiting from a low power state, etc.

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

Exemplary embodiments include a computing system with a processor(s) and an I/O unit(s) (e.g., requesters) interconnected to a memory system that contains a memory controller and memory devices. In exemplary embodiments, the memory system includes a processor or memory controller interfaced to a set of hub devices (also referred to as "hub chips"). The hub devices connect and interface to the memory devices via signals which include clock signals. In exemplary embodiments the computer memory system includes a physical memory array with a plurality of memory devices for storing data and instructions. These memory devices may be connected directly to the memory controller and/or indirectly coupled to the memory controller through hub devices. In exemplary embodiments, the hub-based computer memory system has memory devices attached to a communication hub device that is connected to a memory control device (e.g., a memory controller). Also in exemplary embodiments, the hub device is located on a memory module (e.g, a single substrate or physical device) that includes two or more hub devices that are cascaded interconnected to each other (and possibly to another hub device located on another memory module) via the memory bus.

Hub devices may be connected to the memory controller through a multi-drop or point-to-point bus structure (which may further include a cascade connection to one or more additional hub devices). Memory access requests are transmitted by the memory controller through the bus structure (e.g., the memory bus) to the selected hub(s). In response to receiving the memory access requests, the hub device translates the memory access requests to control the memory devices to store write data from the hub device or to provide read data to the hub device. Read data is encoded into one or more communication packet(s) and transmitted through the memory bus(ses) to the memory controller.

In alternate exemplary embodiments, the memory controller(s) may be integrated together with one or more processor chips and supporting logic, packaged in a discrete chip (commonly called a "northbridge" chip), included in a multi-chip carrier with the one or more processors and/or supporting logic, or packaged in various alternative forms that best match the application/environment. Any of these solutions may or may not employ one or more narrow/high speed links to connect to one or more hub chips and/or memory devices.

The memory modules may be implemented by a variety of technology including a DIMM, a single in-line memory module (SIMM) and/or other memory module or card structures. In general, a DIMM refers to a small circuit board which is comprised primarily of random access memory (RAM) integrated circuits or die on one or both sides with signal and/or power pins on both sides of the board. This can be contrasted to a SIMM which is a small circuit board or substrate composed primarily of RAM integrated circuits or die on one or both sides and single row of pins along one long edge. The DIMM depicted in FIG. 1 includes 168 pins in the exemplary embodiment, whereas subsequent DIMMs have been constructed with pincounts ranging from 100 pins to over 300 pins. In exemplary embodiments described herein, memory modules may include two or more hub devices.

In exemplary embodiments, the memory bus is constructed using multi-drop connections to hub devices on the memory modules and/or using point-to-point connections. The downstream portion of the controller interface (or memory bus), referred to as the downstream bus, may include command, address, data and other operational, initialization or status information being sent to the hub devices on the memory modules. Each hub device may simply forward the information to the subsequent hub device(s) via bypass circuitry; receive, interpret and re-drive the information if it is determined to be targeting a downstream hub device; re-drive some or all of the information without first interpreting the information to determine the intended recipient; or perform a subset or combination of these options.

The upstream portion of the memory bus, referred to as the upstream bus, returns requested read data and/or error, status or other operational information, and this information may be forwarded to the subsequent hub devices via bypass circuitry; be received, interpreted and re-driven if it is determined to be targeting an upstream hub device and/or memory controller in the processor complex; be re-driven in part or in total without first interpreting the information to determine the intended recipient; or perform a subset or combination of these options.

In alternate exemplary embodiments, the point-to-point bus includes a switch or bypass mechanism which results in the bus information being directed to one of two or more possible hub devices during downstream communication (communication passing from the memory controller to a hub device on a memory module), as well as directing upstream information (communication from a hub device on a memory module to the memory controller), often by way of one or more upstream hub devices. Further embodiments include the use of continuity modules, such as those recognized in the art, which, for example, can be placed between the memory controller and a first populated hub device (i.e., a hub device that is in communication with one or more memory devices), in a cascade interconnect memory system, such that any intermediate hub device positions between the memory controller and the first populated hub device include a means by which information passing between the memory controller and the first populated hub device can be received even if the one or more intermediate hub device position(s) do not include a hub device. The continuity module(s) may be installed in any module position(s), subject to any bus restrictions, including the first position (closest to the main memory controller, the last position (prior to any included termination) or any intermediate position(s). The use of continuity modules may be especially beneficial in a multi-module cascade interconnect bus structure, where an intermediate hub device on a memory module is removed and replaced by a continuity module, such that the system continues to operate after the removal of the intermediate hub device. In more common embodiments, the continuity module(s) would include either interconnect wires to transfer all required signals from the input(s) to the corresponding output(s), or be re-driven through a repeater device. The continuity module(s) might further include a non-volatile storage device (such as an EEPROM), but would not include main memory storage devices.

In exemplary embodiments, the memory system includes one or more hub devices on one or more memory modules connected to the memory controller via a cascade interconnect memory bus, however other memory structures may be implemented such as a point-to-point bus, a multi-drop memory bus or a shared bus. Depending on the signaling methods used, the target operating frequencies, space, power, cost, and other constraints, various alternate bus structures may be considered. A point-to-point bus may provide the optimal performance in systems produced with electrical interconnections, due to the reduced signal degradation that may occur as compared to bus structures having branched signal lines, switch devices, or stubs. However, when used in systems requiring communication with multiple devices or subsystems, this method will often result in significant added component cost and increased system power, and may reduce the potential memory density due to the need for intermediate buffering and/or re-drive.

Although not shown in the Figures, the memory modules or hub devices may also include a separate bus, such as a 'presence detect' bus, an I2C bus and/or an SMBus which is used for one or more purposes including the determination of the hub device an/or memory module attributes (generally after power-up), the reporting of fault or status information to the system, the configuration of the hub device(s) and/or memory subsystem(s) after power-up or during normal operation or other purposes. Depending on the bus characteristics, this bus might also provide a means by which the valid completion of operations could be reported by the hub devices and/or memory module(s) to the memory controller (s), or the identification of failures occurring during the execution of the main memory controller requests.

Performances similar to those obtained from point-to-point bus structures can be obtained by adding switch devices. These and other solutions offer increased memory packaging density at lower power, while retaining many of the characteristics of a point-to-point bus. Multi-drop busses provide an alternate solution, albeit often limited to a lower operating frequency, but at a cost/performance point that may be advantageous for many applications. Optical bus solutions permit significantly increased frequency and bandwidth potential, either in point-to-point or multi-drop applications, but may incur cost and space impacts.

As used herein the term "buffer" or "buffer device" refers to a temporary storage unit (as in a computer), especially one that accepts information at one rate and delivers it another. In exemplary embodiments, a buffer is an electronic device that provides compatibility between two signals (e.g., changing voltage levels or current capability). The term "hub" is sometimes used interchangeably with the term "buffer." A hub is a device containing multiple ports that is connected to several other devices. A port is a portion of an interface that serves a congruent I/O functionality (e.g., a port may be utilized for sending and receiving data, address, and control information over one of the point-to-point links, or busses). A hub may be a central device that connects several systems, subsystems, or networks together. A passive hub may simply forward messages, while an active hub, or repeater, amplifies and refreshes the stream of data which otherwise would deteriorate over a distance. The term hub device, as used herein, refers to a hub chip that includes logic (hardware and/or software) for performing memory functions.

Also as used herein, the term "bus" refers to one of the sets of conductors (e.g., wires, and printed circuit board traces or connections in an integrated circuit) connecting two or more functional units in a computer. The data bus, address bus and control signals, despite their names, constitute a single bus since each are often useless without the others. A bus may include a plurality of signal lines, each signal line having two or more connection points, that form a main transmission path that electrically connects two or more transceivers, transmitters and/or receivers. The term "bus" is contrasted with the term "channel" which is often used to describe the function of a "port" as related to a memory controller in a memory system, and which may include one or more busses or sets of busses. The term "channel" as used herein refers to a port on a memory controller. Note that this term is often used in conjunction with I/O or other peripheral equipment, however the term channel has been adopted by some to describe the interface between a processor or memory controller and one of one or more memory subsystem(s).

Further, as used herein, the term "daisy chain" refers to a bus wiring structure in which, for example, device A is wired to device B, device B is wired to device C, etc,. The last device is typically wired to a resistor or terminator. All devices may receive identical signals or, in contrast to a simple bus, each device may modify one or more signals before passing them on. A "cascade" or cascade interconnect' as used herein refers to a succession of stages or units or a collection of interconnected networking devices, typically hubs, in which the hubs operate as a logical repeater, further permitting merging data to be concentrated into the existing data stream. Also as used herein, the term "point-to-point" bus and/or link refers to one or a plurality of signal lines that may each include one or more terminators. In a point-to-point bus and/or link, each signal line has two transceiver connection points, with each transceiver connection point coupled to transmitter circuitry, receiver circuitry or transceiver circuitry. A signal line refers to one or more electrical conductors or optical carriers, generally configured as a single carrier or as two or more carriers, in a twisted, parallel, or concentric arrangement, used to transport at least one logical signal.

Memory devices are generally defined as integrated circuits that are composed primarily of memory (storage) cells, such as DRAMs (Dynamic Random Access Memories), SRAMs (Static Random Access Memories), FeRAMs (Ferro-Electric RAMs), MRAMs (Magnetic Random Access Memories), Flash Memory and other forms of random access and related memories that store information in the form of electrical, optical, magnetic, biological or other means. In exemplary embodiments, dynamic memory device types include various forms of synchronous DRAMs, (e.g. QDR (Quad Data Rate) Synchronous DRAMs or other expected follow-on devices to DDR2 or DDR3 such as DDR4, DDR5 and related technologies such as Graphics RAMs, Video RAMs and/or LP RAMs (Low Power DRAMs)—the latter technologies often based on the fundamental functions, features and/or interfaces found on related DRAMs.

Memory devices may be utilized in the form of chips (die) and/or single or multi-chip packages of various types and configurations. In multi-chip packages, the memory devices may be packaged with other device types such as other memory devices, logic chips, analog devices and programmable devices, and may also include passive devices such as resistors, capacitors and inductors. These packages may include an integrated heat sink or other cooling enhancements, which may be further attached to the immediate carrier or another nearby carrier or heat removal system.

Module support devices (such as buffers, hubs, hub logic chips, registers, PLL's, DLL's, non-volatile memory, etc) may be comprised of multiple separate chips and/or components, may be combined as multiple separate chips onto one or more substrates, may be combined onto a single package or even integrated onto a single device—based on technology, power, space, cost and other tradeoffs. In addition, one or more of the various passive devices such as resistors, capacitors may be integrated into the support chip packages, or into the substrate, board or raw card itself, based on technology, power, space, cost and other tradeoffs. These packages may include an integrated heat sink or other cooling enhancements, which may be further attached to the immediate carrier or another nearby carrier or heat removal system.

Memory devices, hubs, buffers, registers, clock devices, passives and other memory support devices and/or components may be attached to the memory subsystem and/or hub device via various methods including solder interconnects, conductive adhesives, socket structures, pressure contacts and other methods which enable communication between the two or more devices via electrical, optical or alternate means.

The one or more memory modules (or memory subsystems) and/or hub devices may be electrically connected to the memory system, processor complex, computer system or other system environment via one or more methods such as soldered interconnects, connectors, pressure contacts, conductive adhesives, optical interconnects and other communication and power delivery methods. Connector systems may include mating connectors (male/female), conductive contacts and/or pins on one carrier mating with a male or female connector, optical connections, pressure contacts (often in conjunction with a retaining mechanism) and/or one or more of various other communication and power delivery methods. The interconnection(s) may be disposed along one or more edges of the memory assembly and/or placed a distance from an edge of the memory subsystem depending on such application requirements as ease-of-upgrade/repair, available space/volume, heat transfer, component size and shape and other related physical, electrical, optical, visual/physical access, etc. Electrical interconnections on a memory module are often referred to as contacts, or pins, or tabs. Electrical interconnections on a connector are often referred to as contacts or pins.

As used herein, the term memory subsystem refers to, but is not limited to: one or more memory devices; one or more memory devices and associated interface and/or timing/control circuitry; and/or one or more memory devices in conjunction with a memory buffer, hub device, and/or switch. The term memory subsystem may also refer to one or more memory devices, in addition to any associated interface and/or timing/control circuitry and/or a memory buffer, hub device or switch, assembled into a substrate, a card, a module or related assembly, which may also include a connector or similar means of electrically attaching the memory subsystem with other circuitry. The memory modules described herein may also be referred to as memory subsystems because they include one or more memory devices and hub devices Additional functions that may reside local to the memory subsystem and/or hub device include write and/or read buffers, one or more levels of memory cache, local pre-fetch logic, data encryption/decryption, compression/decompression, protocol translation, command prioritization logic, voltage and/or level translation, error detection and/or correction circuitry, data scrubbing, local power management circuitry and/or reporting, operational and/or status registers, initialization circuitry, performance monitoring and/or control, one or more co-processors, search engine(s) and other functions that may have previously resided in other memory subsystems. By placing a function local to the memory subsystem, added performance may be obtained as related to the specific function, often while making use of unused circuits within the subsystem.

Memory subsystem support device(s) may be directly attached to the same substrate or assembly onto which the memory device(s) are attached, or may be mounted to a separate interposer or substrate also produced using one or more of various plastic, silicon, ceramic or other materials which include electrical, optical or other communication paths to functionally interconnect the support device(s) to the memory device(s) and/or to other elements of the memory or computer system.

Information transfers (e.g. packets) along a bus, channel, link or other naming convention applied to an interconnection method may be completed using one or more of many signaling options. These signaling options may include such methods as single-ended, differential, optical or other approaches, with electrical signaling further including such methods as voltage or current signaling using either single or multi-level approaches. Signals may also be modulated using such methods as time or frequency, non-return to zero, phase shift keying, amplitude modulation and others. Voltage levels are expected to continue to decrease, with 1.5V, 1.2V, 1V and lower signal voltages expected consistent with (but often independent of) the reduced power supply voltages required for the operation of the associated integrated circuits themselves.

One or more clocking methods may be utilized within the memory subsystem and the memory system itself, including global clocking, source-synchronous clocking, encoded clocking or combinations of these and other methods. The clock signaling may be identical to that of the signal lines themselves, or may utilize one of the listed or alternate methods that is more conducive to the planned clock frequency (ies), and the number of clocks and/or clock phases planned within the various subsystems. A single clock may be associated with all communication to and from the memory, as well as all clocked functions within the memory subsystem, or multiple clocks may be sourced using one or more methods such as those described earlier. When multiple clocks are used, the functions within the memory subsystem may be associated with a clock that is uniquely sourced to the subsystem, or may be based on a clock that is derived from the clock related to the information being transferred to and from the memory subsystem (such as that associated with an encoded clock). Alternately, a unique clock may be used for the information transferred to the memory subsystem, and a separate clock for information sourced from one (or more) of the memory subsystems. The clocks themselves may operate at the same or frequency multiple of the communication or functional frequency, may include 2, 4, 8, 13 or more phases per 360 degree clock period and may be edge-aligned, center-aligned or placed in an alternate timing position relative to the data, command or address information. Exemplary open-loop quadrature (or octal, ...) clock generators may be used in one or more devices comprising the memory system/subsystem, wherein the memory device transfers data at a rate of one or more data transfers occurring for each output clock phase.

Information passing to the memory subsystem(s) will generally be composed of address, command and data, as well as other signals generally associated with requesting or reporting status or error conditions, resetting the memory, completing memory or logic initialization and other functional, configuration or related information. Information passing from the memory subsystem(s) may include any or all of the information passing to the memory subsystem(s), however generally will not include address and command information. This information may be communicated using communication methods that may be consistent with normal memory device interface specifications (generally parallel in nature), the information may be encoded into a 'packet' structure, which may be consistent with future memory interfaces or simply developed to increase communication bandwidth and/or enable the subsystem to operate independently of the memory technology by converting the received information into the format required by the receiving device(s).

Initialization of the memory subsystem may be completed via one or more methods, based on the available interface busses, the desired initialization speed, available space, cost/complexity objectives, subsystem interconnect structures, the use of alternate processors (such as a service processor) which may be used for this and other purposes, etc. In one embodiment, the high speed bus may be used to complete the initialization of the memory subsystem(s), generally by first completing a training process to establish reliable communication, then by interrogation of the attribute or 'presence detect' data associated the various components and/or characteristics associated with that subsystem, and ultimately by programming the appropriate devices with information associated with the intended operation within that system. In a cascaded system, communication with the first memory subsystem would generally be established, followed by subsequent (downstream) subsystems in the sequence consistent with their position along the cascade interconnect bus.

A second initialization method would include one in which the high speed bus is operated at one frequency during the initialization process, then at a second (and generally higher) frequency during the normal operation. In this embodiment, it may be possible to initiate communication with all of the memory subsystems on the cascade interconnect bus prior to completing the interrogation and/or programming of each subsystem, due to the increased timing margins associated with the lower frequency operation.

A third initialization method might include operation of the cascade interconnect bus at the normal operational frequency (ies), while increasing the number of cycles associated with each address, command and/or data transfer. In one embodiment, a packet containing all or a portion of the address, command and/or data information might be transferred in one clock cycle during normal operation, but the same amount and/or type of information might be transferred over two, three or more cycles during initialization. This initialization process would therefore be using a form of 'slow' commands, rather than 'normal' commands, and this mode might be automatically entered at some point after power-up and/or re-start by each of the subsystems and the memory controller by way of POR (power-on-reset) logic included in each of these subsystems.

A fourth initialization method might utilize a distinct bus, such as a presence detect bus (such as the one defined in U.S. Pat. No. 5,513,135 to Dell et al., of common assignment herewith), an I2C bus (such as defined in published JEDEC standards such as the 168 Pin DIMM family in publication 21-C revision 7R8) and/or the SMBUS, which has been widely utilized and documented in computer systems using such memory modules. This bus might be connected to one or more modules within a memory system in a daisy chain/cascade interconnect, multi-drop or alternate structure, providing an independent means of interrogating memory subsystems, programming each of the one or more memory subsystems to operate within the overall system environment, and adjusting the operational characteristics at other times during the normal system operation based on performance, thermal, configuration or other changes desired or detected in the system environment.

Other methods for initialization can also be used, in conjunction with or independent of those listed. The use of a separate bus, such as described in the fourth embodiment above, also offers the advantage of providing an independent means for both initialization and uses other than initialization, such as described in U.S. Pat. No. 6,381,685 to Dell et al., of common assignment herewith, including changes to the subsystem operational characteristics on-the-fly and for the reporting of and response to operational subsystem information such as utilization, temperature data, failure information or other purposes.

With improvements in lithography, better process controls, the use of materials with lower resistance, increased field sizes and other semiconductor processing improvements, increased device circuit density (often in conjunction with increased die sizes) will help facilitate increased function on integrated devices as well as the integration of functions previously implemented on separate devices. This integration will serve to improve overall performance of the intended function, as well as promote increased storage density, reduced power, reduced space requirements, lower cost and other manufacturer and customer benefits. This integration is a natural evolutionary process, and may result in the need for structural changes to the fundamental building blocks associated with systems.

The integrity of the communication path, the data storage contents and all functional operations associated with each element of a memory system or subsystem can be assured, to a high degree, with the use of one or more fault detection and/or correction methods. Any or all of the various elements may include error detection and/or correction methods such as CRC (Cyclic Redundancy Code), EDC (Error Detection and Correction), parity or other encoding/decoding methods suited for this purpose. Further reliability enhancements may include operation re-try (to overcome intermittent faults such as those associated with the transfer of information), the use of one or more alternate or replacement communication paths to replace failing paths and/or lines, complement-re-complement techniques or alternate methods used in computer, communication and related systems.

The use of bus termination, on busses as simple as point-to-point links or as complex as multi-drop structures, is becoming more common consistent with increased performance demands. A wide variety of termination methods can be identified and/or considered, and include the use of such devices as resistors, capacitors, inductors or any combination thereof, with these devices connected between the signal line and a power supply voltage or ground, a termination voltage or another signal. The termination device(s) may be part of a passive or active termination structure, and may reside in one or more positions along one or more of the signal lines, and/or as part of the transmitter and/or receiving device(s). The terminator may be selected to match the impedance of the transmission line, or selected via an alternate approach to maximize the useable frequency, operating margins and related attributes within the cost, space, power and other constraints.

Technical effects and benefits of include the ability to construct a low cost and fast locking solution for generating multiple (e.g. quadrature, octal, etc.) clock phases within an accuracy of within a few degrees, while reducing phase error and input jitter on the output multiple phase clock.

As described above, the embodiments of the invention may be embodied in the form of computer-implemented processes and apparatuses for practicing those processes. Embodiments of the invention may also be embodied in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

The invention claimed is:

1. A ring oscillator structure, the ring oscillator comprising:
   input inverters for receiving an input clock;
   forward direction loop inverters;
   backward direction loop inverters;
   one or more output nodes; and
   cross-coupled latches connected between any two opposite nodes,
   wherein the ring oscillator is preceded by a circuit to generate coarse quadrature clock phases from a differential input clock.

2. The ring oscillator of claim 1 further comprising input nodes for receiving the input clock, the input nodes coupled to the input inverters.

3. The ring oscillator of claim 1, wherein the input clock is a differential clock.

4. The ring oscillator of claim 1, wherein the ring oscillator circuitry develops a four phase, eight phase, twelve phase, or other multiple phase clock having a "2×n" relationship to the input clock, where n is an even integer.

5. The ring oscillator of claim 1, wherein the circuit to generate coarse quadrature clock phases is preceded by an input level adjusting circuit.

6. The ring oscillator of claim 1, wherein the ring oscillator is included in an integrated processor chip.

7. An open-loop clock generating circuit comprising:
   a coarse quadrature phase generating circuit for receiving a differential clock pair and generating a coarse four phase clock;
   one or more quadrature phase generating circuits in sequence for receiving the coarse four phase clock and for generating a four phase clock, the quadrature phase generating circuits each including forward direction loop inverters, backward direction loop inverters, output nodes, and cross-coupled latches connected between any two opposite nodes;
   an input level adjusting circuit preceding the coarse quadrature phase generating circuit for ensuring that the voltage levels on the differential clock have the same value of V-low and V-high relative to VDD.

8. The circuit of claim 7, further comprising one or more octal phase generating circuits for receiving the four phase clock and generating an eight phase clock, the octal phase generating circuits each including forward direction loop inverters, backward direction loop inverters, cross-coupled latches connected between any two opposite nodes and input inverters.

9. The circuit of claim 7, wherein the circuit is included in an integrated processor chip.

10. A ring oscillator structure, the ring oscillator comprising:
- input inverters for receiving an input clock;
- forward direction loop inverters;
- backward direction loop inverters;
- one or more output nodes outputting a multiple phase clock; and
- cross-coupled latches connected between any two opposite nodes,
- wherein the ring oscillator is included in one or more of a memory controller, a hub device and a memory device, and data is transferred at a transfer rate that is equal to the greater of four and the number of output clock phases output at the one or more ring oscillator output nodes bits per clock cycle.

11. An open-loop clock generating circuit comprising:
- a coarse quadrature phase generating circuit for receiving a differential clock pair and generating a coarse four phase clock;
- one or more quadrature phase generating circuits in sequence for receiving the coarse four phase clock and for generating a four phase clock, the quadrature phase generating circuits each including forward direction loop inverters, backward direction loop inverters, output nodes, and cross-coupled latches connected between any two opposite nodes; and
- one or more twelve phase generating circuits for receiving the four phase clock and generating a twelve phase clock, the twelve phase generating circuits each including forward direction loop inverters, backward direction loop inverters, cross-coupled latches connected between any two opposite nodes and input inverters.

12. An open-loop clock generating circuit comprising:
- a coarse quadrature phase generating circuit for receiving a differential clock pair and generating a coarse four phase clock; and
- one or more quadrature phase generating circuits in sequence for receiving the coarse four phase clock and for generating a four phase clock, the quadrature phase generating circuits each including forward direction loop inverters, backward direction loop inverters, output nodes, and cross-coupled latches connected between any two opposite nodes,
- wherein the open-loop clock generating circuit is included in one or more of a memory controller, a hub device and a memory device, and
- data is transferred to or from the memory device at a rate of four bits for every clock cycle.

* * * * *